(12) United States Patent
Morrison et al.

(10) Patent No.: US 11,810,750 B2
(45) Date of Patent: Nov. 7, 2023

(54) ROTATABLE STAGE

(71) Applicant: QUORUM TECHNOLOGIES LTD, Laughton (GB)

(72) Inventors: Robert Morrison, Laughton (GB); Kenneth Costello, Laughton (GB)

(73) Assignee: Quorum Technologies Ltd., Laughton (GB)

( * ) Notice: Subject to any disclaimer, the term of this patent is extended or adjusted under 35 U.S.C. 154(b) by 382 days.

(21) Appl. No.: 16/975,585

(22) PCT Filed: Feb. 25, 2019

(86) PCT No.: PCT/GB2019/050501
§ 371 (c)(1),
(2) Date: Aug. 25, 2020

(87) PCT Pub. No.: WO2019/162693
PCT Pub. Date: Aug. 29, 2019

(65) Prior Publication Data
US 2020/0411276 A1  Dec. 31, 2020

(30) Foreign Application Priority Data
Feb. 26, 2018  (GB) ...................................... 1803071

(51) Int. Cl.
*H01J 37/20* (2006.01)
*H01J 37/28* (2006.01)

(52) U.S. Cl.
CPC ............. *H01J 37/20* (2013.01); *H01J 37/28* (2013.01); *H01J 2237/2001* (2013.01); *H01J 2237/20214* (2013.01)

(58) Field of Classification Search
None
See application file for complete search history.

(56) References Cited

U.S. PATENT DOCUMENTS

| 8,754,384 | B1 * | 6/2014 | Persoon | H01J 37/20 250/306 |
|---|---|---|---|---|
| 2005/0051098 | A1 | 3/2005 | Aramaki et al. | |
| 2013/0288182 | A1 * | 10/2013 | Branton | H10K 71/20 204/192.12 |

FOREIGN PATENT DOCUMENTS

| JP | 57186633 | | 11/1982 |
|---|---|---|---|
| JP | 02144843 | | 6/1990 |
| JP | 02144843 | A * | 6/1990 |
| JP | H02144843 | | 6/1990 |
| JP | 1990144843 | | 5/1992 |
| JP | 04184851 | A * | 7/1992 |
| JP | H04184851 | | 7/1992 |
| JP | 200095586 | | 1/1997 |
| JP | 11509606 | | 8/1999 |

(Continued)

OTHER PUBLICATIONS

International Search Report and Written Opinion dated PCT/GB2019/050501 dated Jun. 21, 2019.

(Continued)

*Primary Examiner* — Andrew Smyth
(74) *Attorney, Agent, or Firm* — Wissing Miller LLP

(57) ABSTRACT

A rotatable stage for an analytical apparatus. The rotatable stage has a stator, a heat exchanger in thermal connection with the stator, a rotor and a bearing located between the stator and the rotor. The bearing provides a thermal connection between the stator and rotor.

22 Claims, 3 Drawing Sheets

(56) References Cited

FOREIGN PATENT DOCUMENTS

| | | | | |
|---|---|---|---|---|
| JP | H11509606 A | * | 8/1999 | |
| JP | 2010161079 A | * | 7/2010 | .......... H01J 37/3171 |
| JP | 2014153362 | | 8/2014 | |

OTHER PUBLICATIONS

Combined Search and Examination Report dated GB1803071.8 dated Aug. 23, 2018.
METALCOR GMBH, 2.1247 CuBe2, metalcor.de [online] Available from: http:www.metalcor.de/en/datenblatt/137/[Accessed Aug. 16, 2018].
International Preliminary Report on Patentability mailed in PCT/GB2019/050501 dated Aug. 27, 2020.
English language Office Action for Japanese Application No. 2020-567644, dated Jan. 4, 2023.

* cited by examiner

ROTATABLE STAGE

This application is a 371 of PCT/GB2019/050501, filed on Feb. 25, 2019, published on Aug. 29, 2019 under publication number WO 2019/162693, which claims priority benefits from United Kingdom Patent Application No. 1803071.8, filed on Feb. 26, 2018, the disclosure of which is incorporated herein by reference.

TECHNICAL FIELD

The present invention relates to a rotatable stage for an analytical apparatus, such as a microscope, for example an electron microscope. The rotatable stage provides a cold environment for a sample to be analysed.

BACKGROUND

An electron microscope uses a focused beam of electrons to interact with atoms on the surface of a sample and produces information about the sample's surface topography and composition. A well-known type of electron microscope is a scanning electron microscope (SEM).

It can be desirable to move the sample in the electron microscope, both linearly and rotationally. For example, rotation is important to allow the correct orientation of the specimen under the electron beam for many imaging and preparation operations. An electron microscope typically has a specimen stage onto which the sample is either mounted directly, or indirectly, via a sample holder. Modules may be provided between the specimen stage and the sample, for example a rotate module may be provided to provide rotational motion. The specimen stage may provide linear movement.

Electron microscopy takes place under vacuum conditions. Some samples (either biological or non-biological) are sensitive to electron beams and require freezing to limit damage from the electron beam. When biological samples or samples with a high water content are exposed to the vacuum conditions of an electron microscope, any liquid in the sample immediately begins to evaporate, which causes major deformation. To overcome these problems, samples are rapidly frozen prior to being placed in the electron microscope. They are then held as close as possible to the temperature of liquid nitrogen (−196° C.) whilst analysis in the microscope takes place.

A cold stage is typically used to maintain the low temperature of the sample during scanning. The sample is placed on the cold stage, which maintains the low temperature of the sample. The cold stage is mounted directly or indirectly on the specimen stage. Current cold stage designs use either copper braids connecting the stage to a reservoir of liquid nitrogen or pass cold nitrogen gas through tubes connected to the stage to reach the required temperature. Biological samples must be kept below −165° C. to avoid deterioration. The use of gas cooled cold stages allows cooling to about −191° C. and the use of braid cooled cold stages allows cooling to about −170° C.

Cold stages have the disadvantage that they do not allow both cooling and rotation of the sample. This is due to the braids and tubes connecting the liquid nitrogen reservoir to the cold stage preventing rotation of the cold stage. As the cold stage is tethered to either the braids or gas tubes, rotation would cause shearing of the braids or gas tubes.

It is an object of the invention to overcome disadvantages associated with the prior art.

SUMMARY OF THE INVENTION

An aspect of the invention provides a rotatable stage for an analytical apparatus, the rotatable stage comprising:
 a stator;
 a heat exchanger in thermal connection with the stator;
 a rotor; and
 a bearing located between the stator and the rotor, the bearing providing a thermal connection between the stator and rotor.

The bearing may comprise a material having a thermal conductivity of greater than about 170 $Wm^{-1}K^{-1}$.

An aspect of the invention provides a rotatable stage for an analytical apparatus, the rotatable stage comprising:
 a stator;
 a heat exchanger in thermal connection with the stator;
 a rotor; and
 a bearing located between the stator and the rotor, the bearing comprising a material having a thermal conductivity of greater than about 170 $Wm^{-1}K^{-1}$, to provide a thermal connection between the stator and rotor.

The use of a highly thermally conductive bearing allows the rotor to be efficiently cooled. This enables the low temperature of a sample mounted on the rotor to be maintained.

The bearing may be configured to provide multiple points of contact between the bearing and the stator and between the bearing and the rotor respectively. The multiple points of contact enhance the thermal connection between the stator and rotor. The bearing may be configured to provide at least 12 points of contact between the bearing and the stator and the bearing and the rotor respectively. In one embodiment, the bearing may be configured to provide at least 100 points of contact between the bearing and the stator and the bearing and the rotor respectively.

The bearing may comprise one continuous component. The bearing may comprise a coiled spring. The use of a coiled spring has the advantage of providing many points of contact between the stator and the bearing and between the rotor and the bearing respectively, thereby providing an efficient thermal link between them, whilst having low friction. For example, each coil of the coiled spring may have one point of contact with the stator and one point of contact with the rotor. The coiled spring is very tolerant to machining variations in the component parts. The coiled spring may comprise a canted coiled spring. The canted coiled spring may have an elliptical cross-section.

The material of the bearing may comprise at least one of copper, phosphor, bronze, and $CuBe_2$. The material of the bearing may comprise an alloy. In one embodiment the material of the bearing comprises a copper alloy.

Suitably, the bearing may comprise a material having a Rockwell hardness of between about 45 Rb and about 94 Rb.

The analytical apparatus may comprise a microscope, for example an electron microscope. Examples of suitable analytical apparatus include scanning electron microscopes (SEM), focussed ion beam instruments (FIB) such as a focussed ion beam scanning electron microscopes (FIB-SEM), and X-ray beamline end stations.

The heat exchanger may comprise a gas tube, wherein the gas tube is configured to receive cold gas. The cold gas may be cooled, i.e. below ambient temperature. The cold gas may have a temperature of −170° C. or below. The gas may comprise nitrogen gas. For example, the cold gas may comprise cooled nitrogen gas, at a temperature in the range of just below ambient temperature to −196° C. In an alternative embodiment, the heat exchanger may comprise a cooled braid. The braid may comprise a copper braid.

The rotatable stage may comprise a connection providing thermal conduction between the heat exchanger and a second heat exchanger. The connection may be flexible. This flexible connection allows movement of the stator relative to the electron microscope. For example, the stator may be mounted on a specimen stage adapted for linear movement, for example in X and Y. The connection may comprise a portion of the gas tube or the thermally conductive braid.

The second heat exchanger may be configured to remove heat. The second heat exchanger may be in contact with liquid nitrogen.

The stator comprises a temperature sensor.

The rotatable stage may comprise means for:
receiving a temperature input from the temperature sensor indicative of the temperature of the stator; and
determining automatically from the temperature input whether the temperature of the stator is within a predetermined range; and
controlling the temperature of the heat exchanger to ensure that the temperature of the stator stays within the predetermined range.

The rotatable stage may comprise:
an electronic processor having an electrical input for receiving a stator temperature data signal, the stator temperature data signal being automatically generated and output by a temperature sensor;
an electronic memory device electrically coupled to the electronic processor and having instructions stored therein;
wherein the electronic processor is configured to access the memory device and execute the instructions stored therein such that it is operable to:
determine from the stator temperature data whether the temperature of the stator is within a predetermined range.

The system may comprise a controller and suitably comprises a control unit or computational device having one or more electronic processors.

Controlling the temperature of the heat exchanger may comprise controlling the flow of cold gas through the gas tube.

A feedback loop to maintain a fixed temperature at the stator is thus provided.

An aspect of the invention may provide an electron microscope comprising a vacuum chamber and a rotatable stage according to any one of the preceding claims, wherein the stator, rotor and thermally conductive coiled spring are located in the vacuum chamber.

An aspect of the invention provides an electron microscope comprising a specimen stage and wherein the stator is mounted on the specimen stage via a thermally insulated support.

The electron microscope may comprise a stage rotate module, mounted directly or indirectly on the specimen stage, wherein the rotor is mounted via thermally isolating supports to the stage rotate module.

An aspect of the invention provides a method for cooling the rotor of a rotatable stage comprising a stator, a heat exchanger in thermal connection with the stator, a rotor and a bearing located between the stator and the rotor, the bearing providing a thermal connection between the stator and rotor, the method comprising:
thermally cooling the heat exchanger of the stator to thereby cool the rotor via the thermally conductive bearing.

The bearing may comprise a material having a thermal conductivity of greater than about 170 $Wm^{-1}K^{-1}$. The bearing may comprise a material having a thermal conductivity of greater than about 140 $Wm^{-1}K^{-1}$, greater than about 150 $Wm^{-1}K^{-1}$, greater than about 160 $Wm^{-1}K^{-1}$, or greater than about 170 $Wm^{-1}K^{-1}$. The bearing may comprise a material having a thermal conductivity in the range of about 140 $Wm^{-1}K^{-1}$ to about 170 $Wm^{-1}K^{-1}$.

An aspect of the invention provides a method for cooling the rotor of a rotatable stage comprising a stator, a heat exchanger in thermal connection with the stator, a rotor and a bearing located between the stator and the rotor, the bearing comprising a material having a thermal conductivity of greater than about 170 $Wm^{-1}K^{-1}$, the method comprising:
thermally cooling the heat exchanger of the stator to thereby cool the rotor via the thermally conductive bearing.

The heat exchanger may comprise a gas tube, and the method may comprise the step of passing cold gas through the gas tube.

The gas tube may be cooled to at least −170° C.

The method may comprise simultaneously cooling and rotating the rotor.

An aspect of the invention provides a rotatable stage comprising:
a stator;
a heat exchanger in thermal connection with the stator;
a rotor; and
a bearing located between the stator and the rotor, the bearing providing a thermal connection between the stator and rotor.

The bearing may comprise a material having a thermal conductivity of greater than about 170 $Wm^{-1}K^{-1}$.

The rotatable stage may be used for apparatus which requires both cooling and rotation of the sample. For example, analytical instruments or apparatus for coating samples.

An aspect of the invention may provide a method for cooling the rotor of a rotatable stage comprising a stator, a heat exchanger in thermal connection with the stator, a rotor and a bearing located between the stator and the rotor, the bearing providing a thermal connection between the stator and rotor, the method comprising:
thermally cooling the heat exchanger of the stator to thereby cool the rotor via the thermally conductive bearing.

Throughout the description and claims of this specification, the words "comprise" and "contain" and variations of the words, for example "comprising" and "comprises", mean "including but not limited to", and do not exclude other components, integers or steps. Moreover, the singular encompasses the plural unless the context otherwise requires: in particular, where the indefinite article is used, the specification is to be understood as contemplating plurality as well as singularity, unless the context requires otherwise.

Preferred features of each aspect of the invention may be as described in connection with any of the other aspects. Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible.

BRIEF DESCRIPTION OF THE DRAWINGS

One or more embodiments of the invention will now be described, by way of example only, with reference to the accompanying drawings, in which.

DETAILED DESCRIPTION

Figure 1:
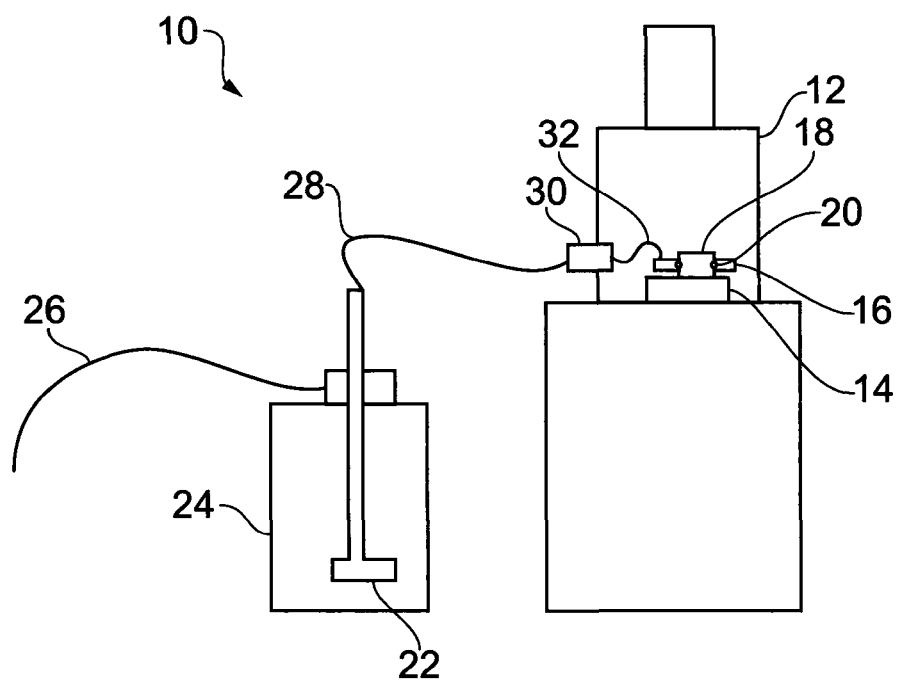
FIG. 1 is a schematic view of an embodiment of the rotatable stage in a scanning electron microscope.

FIG. 1 shows an embodiment of the rotatable stage in a scanning electron microscope. The scanning electron microscope 10 is provided with a vacuum chamber 12 which houses an electron microscope specimen stage 14.

The rotatable stage comprises a static part of the rotatable stage (stator) 16, a rotating part of the rotatable stage (rotor) 18 and bearing 20 between them. The rotor 18 is mounted inside the stator 16, with the bearing 20 enabling rotation between the stator 16 and rotor 18. The rotor 18 is mounted on a microscope stage rotate module mounted on the electron microscope specimen stage 14, via a thermally isolating support (not shown). The stator 16 is mounted by thermally insulating supports (not shown) to the main electron microscope specimen stage 14.

A heat exchanger in thermal connection with the stator 16 is provided in the form of a cooling tube 32 located around the outer circumference of the stator 16. Nitrogen gas cooled close to −196° C. is passed through the cooling tube 32, to thereby cool the stator.

The supply of cooled nitrogen gas is provided via a second heat exchanger 22 placed in a liquid nitrogen Dewar flask 24. A flow of warm, dry nitrogen gas 26 is passed through the heat exchanger submerged in liquid nitrogen where it is cooled to close to −196° C. The cooled nitrogen gas 28 is passed through a vacuum feedthrough 30 into the vacuum chamber 12 and into the cooling tube 32.

The bearing 20 acts as a high efficiency thermal link which connects the stator to the rotor. In this embodiment, the bearing is a circular copper canted coiled spring.

Figure 2:
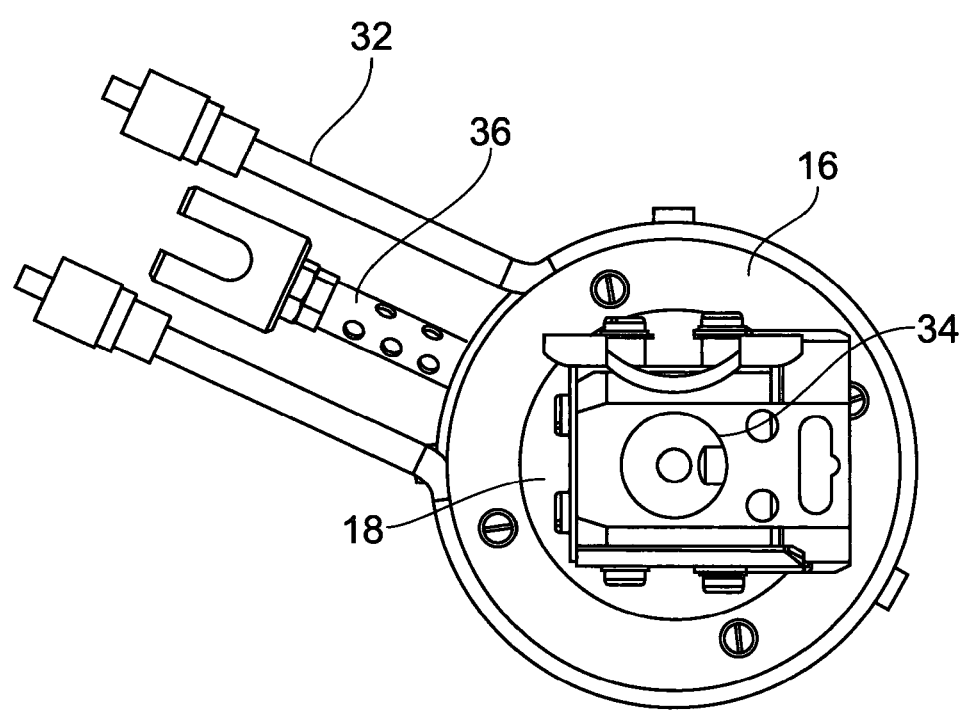
FIG. 2 is a top plan view of the rotatable stage of FIG. 1.

FIG. 2 is a plan view of the rotatable stage in more detail, showing the stator 16 and rotor 18. A sample holder 34 is shown on the rotor 18. The stator 16 is connected to the electron microscope specimen stage 14 via a thermally isolated locator 36. A cooling tube 32 is shown around the outer circumference of the stator 16, enabling the cooled nitrogen gas to circulate around it, thereby cooling the stator.

Figure 3:
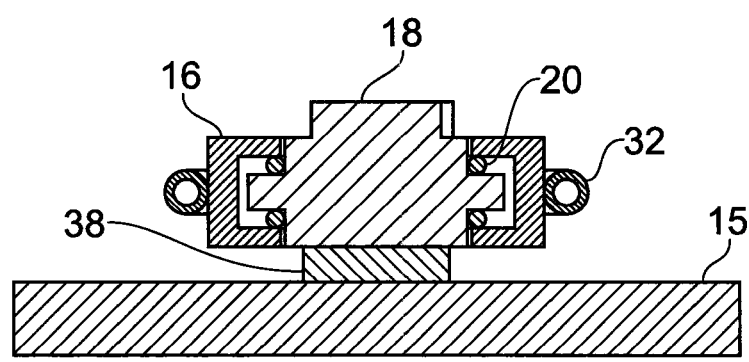
FIG. 3 is a cross sectional view of the rotate stage of FIG. 2.

FIG. 3 is a section through the rotatable stage of FIG. 2. The rotor 18 is shown mounted on the microscope stage rotate module 15 via thermal insulator 38. The rotor 18 is mounted in stator 16 via bearing 20, which comprises a circular copper canted coiled spring. The cooling tube 32 is shown around the periphery of the stator 16.

In an alternative embodiment, the cooling tube could be replaced by a cooling braid.

The cold parts of the system (for example the cooling tube 32 and sample holder 34) are made of gold plated copper for high thermal conductivity and corrosion resistance. The insulating parts (for example thermally isolated locator 36 and thermal insulator 38) are of ceramic and Torlon™ (a high vacuum compatible polymer).

A temperature sensor on the stator (not shown) is used in a feedback loop to maintain a set, fixed temperature by varying the gas flow through the cooling tube 32.

The use of a canted coiled spring has the advantage of ease of assembly, as the rotor, stator and bearing to simply click together.

Using this set up, sample temperatures of less than −175° C. are achieved, well below the required temperature of −165° C.

The invention claimed is:

1. A rotatable stage for an analytical apparatus, the rotatable stage comprising:
    a stator;
    a heat exchanger in thermal connection with the stator;
    a rotor; and
    a bearing located between the stator and the rotor, the bearing providing a thermal connection between the stator and rotor, wherein the bearing comprises a canted coiled spring, wherein one or more portions of the bearing engage with one or more portions of the rotor to limit an axial motion of the rotor.

2. A rotatable stage according to claim 1, wherein the bearing comprises a material having a thermal conductivity of greater than about 170 $Wm^{-1}K^{-1}$.

3. A rotatable stage according to claim 1, wherein the bearing is configured to provide multiple points of contact between the bearing and the stator and multiple points of contact between the bearing and the rotor.

4. A rotatable stage according to claim 3, wherein the bearing is configured to provide at least 12 points of contact between the bearing and the stator and at least 12 points between the bearing and the rotor.

5. A rotatable stage according to claim 1, wherein the bearing comprises one continuous component.

6. A rotatable stage according to claim 1, wherein the material of the bearing comprises at least one of copper, phosphor, bronze, and $CuBe_2$.

7. A rotatable stage according to claim 1, wherein the heat exchanger comprises a gas tube configured to receive cooled gas.

8. A rotatable stage according to claim 1, wherein the heat exchanger comprises a thermally conductive braid.

9. A rotatable stage according to claim 8, wherein the braid comprises a copper braid.

10. A rotatable stage according to claim 1, comprising a connection providing thermal conduction between the heat exchanger and a second heat exchanger, wherein the connection is flexible.

11. A rotatable stage according to claim 1, wherein the stator comprises a temperature sensor.

12. A rotatable stage according to claim 11, further comprising means for:
    receiving a temperature input from the temperature sensor indicative of the temperature of the stator; and
    determining automatically from the temperature input whether the temperature of the stator is within a predetermined range; and
    controlling the temperature of the heat exchanger to ensure that the temperature of the stator stays within the predetermined range.

13. A rotatable stage according to claim 12, wherein the heat exchanger comprises a gas tube configured to receive cooled gas and wherein controlling the temperature of the heat exchanger comprises controlling the flow of cooled gas through the gas tube.

14. An electron microscope comprising a vacuum chamber and a rotatable stage according to claim 1, wherein the stator, rotor and bearing are located in the vacuum chamber.

15. An electron microscope according to claim 14, comprising a specimen stage and wherein the stator is mounted on the specimen stage via a thermally insulated support.

16. An electron microscope according to claim 14, comprising a stage rotate module, mounted on the specimen stage, wherein the rotor is mounted via thermally isolating supports to the stage rotate module.

17. A method for cooling the rotor of a rotatable stage comprising a stator, a heat exchanger in thermal connection with the stator, a rotor and a bearing located between the stator and the rotor, wherein the bearing comprises a canted coil spring, the bearing providing a thermal connection between the stator and rotor and wherein one or more portions of the bearing engage with one or more portions of the rotor to limit an axial motion of the rotor, the method comprising:

thermally cooling the heat exchanger of the stator to thereby cool the rotor via the thermally conductive bearing.

18. A method according to claim 17, wherein the bearing comprises a material having a thermal conductivity of greater than about 170 $Wm^{-1}K^{-1}$.

19. A method according to claim 17, wherein the heat exchanger comprises a gas tube, and the method comprises the step of passing cooled gas through the gas tube.

20. A method according to claim 19, wherein the gas is cooled to at least −170° C.

21. A rotatable stage according to claim 1, wherein the canted coil spring comprises a pair of canted coil springs.

22. The method of claim 17, wherein the canted coil spring comprises a pair of canted coil springs.

\* \* \* \* \*